US006157039A

United States Patent [19]
Mankos

[11] Patent Number: 6,157,039
[45] Date of Patent: Dec. 5, 2000

[54] CHARGED PARTICLE BEAM ILLUMINATION OF BLANKING APERTURE ARRAY

[75] Inventor: Marian Mankos, San Francisco, Calif.

[73] Assignee: Etec Systems, Inc.

[21] Appl. No.: 09/074,558

[22] Filed: May 7, 1998

[51] Int. Cl.[7] .................... H01J 37/153; H01J 37/147
[52] U.S. Cl. ................ 250/492.2; 250/492.22; 250/492.3; 250/494.1
[58] Field of Search ............ 250/492.2, 492.22, 250/492.23, 492.3, 494.1

[56] References Cited

U.S. PATENT DOCUMENTS

| | | | |
|---|---|---|---|
| 4,130,761 | 12/1978 | Matsuda | 250/492 |
| 5,369,282 | 11/1994 | Arai et al. | 250/492.22 |
| 5,466,548 | 11/1995 | Matsui | 430/1 |
| 5,500,527 | 3/1996 | Zarubin | 250/306 |
| 5,631,113 | 5/1997 | Satoh et al. | 430/30 |

FOREIGN PATENT DOCUMENTS

| | | | |
|---|---|---|---|
| 0 087 196 | 8/1983 | European Pat. Off. | H01J 37/30 |
| 0 092 873 | 11/1983 | European Pat. Off. | H01J 37/30 |
| 0 221 657 | 5/1987 | European Pat. Off. | H01J 37/30 |
| 0 314 216 | 5/1989 | European Pat. Off. | H01J 37/30 |
| 0 404 608 | 12/1990 | European Pat. Off. | H01J 37/09 |
| 2 385 222 | 10/1978 | France | H01J 37/30 |
| 59 119666 | 7/1984 | Japan | H01J 37/317 |

OTHER PUBLICATIONS

B. Roelofs et al.: "Feasibility of multi–beam electron lithography" Microelectronic Engineering, vol. 2, No. 4, Dec. 1984, pp. 259–279, XP002111488.

T.H.P. Chang et al.: "Electron–beam microcolumns for lithography and related applications" Journal of Vacuum Science and Technology: Part B, vol. 14, NR. 6, pp. 3774–3781, XP000721110.

H. Yasuda et al., "Multielectron Beam Blanking Aperture Array System SYNAPSE–200*",J. Vac. Sci. Technol. B 14(6) Nov./Dec. 1996, American Vacuum Society, pp. 3813–3820.

*Primary Examiner*—Teresa M. Arroyo
*Assistant Examiner*—Nikita Wells
*Attorney, Agent, or Firm*—Skjerven, Morrill, MacPherson, Franklin & Friel

[57] ABSTRACT

A charged particle beam column efficiently illuminates a blanking aperture array by splitting a charged particle beam into multiple charged particle beams and focusing each charge particle beam on a separate aperture of the blanking aperture array. Where an electron source with a small effective source size is used, for example an electron field emission source or Schottky source, crossovers of the individual beams may occur within the separate apertures of the blanking aperture array. Consequently, no demagnification of the beams passing through the blanking aperture array is necessary to form a small exposure pixel on the writing plane. Thus, for example, electron-electron interactions are minimized, thereby increasing throughput of the system. Further, undesirable scattering of the charged particle off the edge or sidewall of the apertures of the blanking aperture array is avoided. Moreover, regardless of the type of source used, by focusing each individual charged particle beam on the separate apertures of the blanking aperture array, the charged particle beam column minimizes undesirable heating, thermal drift or charging of the blanking aperture array.

32 Claims, 3 Drawing Sheets

CHARGED PARTICLE BEAM ILLUMINATION OF BLANKING APERTURE ARRAY

FIELD OF THE INVENTION

The present invention relates to a charged particle beam exposure apparatus using a blanking aperture array, and in particular to beam splitting the charged particle beam to efficiently illuminate the blanking aperture array.

BACKGROUND

A charged particle beam exposure apparatus, such as an electron beam exposure apparatus, is typically used to direct write a pattern on the surface of a mask blank or substrate during semiconductor processing. Blanking aperture arrays can be used with a charged particle beam exposure apparatus to separate the charged particle beam into multiple beams that are used to generate an array of exposure pixels on the substrate surface as discussed in the article entitled "Multi-electron beam blanking aperture array system SYNAPSE-2000," by Hiroshi Yasuda et al., J. Vac. Sci. Technol. B. 14(6), pp. 3813–3820, Nov/Dec 1996, which is incorporated herein by reference. As is well known in the art, individual apertures of a blanking aperture array can be "opened" or "closed" with an electrical potential applied to deflection plates near each aperture. By controlling which apertures are open or closed to the charged beam, the blanking aperture array may be used to generate the desired pattern of exposure pixels on a substrate surface.

FIG. 1 is a cross-sectional view of a simplified charged particle beam column 10 using a blanking aperture array to generate individual beams. Charged particle beam column 10 is an electron beam exposure apparatus, however, it should be understood that other charged particles, e.g., ions, may alternatively be used. Column 10 is conventionally within a vacuum enclosure.

Column 10 includes an electron source 12 that conventionally generates a electron beam 14 in alignment with an optical axis A. An electrostatic or magnetic electron lens 16 flood-illuminates a blanking aperture array ("BAA") 20 with approximately parallel electron beams 18. Although lens 16 is shown as a single lens, a lens system is often used to generate the desired flood illumination. Typically, the electron source, which is approximately 10 $\mu$m in diameter, requires a large magnification if a large area of BAA 20 is illuminated, which necessitates a large column length.

BAA 20 includes a number of small apertures 20a, which correspond to the desired exposure pixels projected on the writing plane of substrate 28. Typically apertures 20a of BAA 20 are approximately 10 to 50 $\mu$m (micrometers) in diameter or per side if square and one to several aperture sizes apart.

Electron beams 24 pass through each aperture 20a of BAA 20. Electrostatic deflectors 22 are used to "close" individual apertures of BAA 20 by deflecting the electron beam passing through a particular aperture with an electric potential, thereby preventing the electron beam from reaching the writing plane (surface, e.g. of resist) of substrate 28. Electrostatic deflectors 22 are controlled to permit electron beams 24 to pass in accordance with the desired exposure pattern.

Electron beams 24 are then focused with a lens 26, which may be a lens system, onto the writing plane of substrate 28. Because apertures 20a of BAA 20 are approximately 10 $\mu$m in diameter and therefore electron beams 24 are approximately 10 $\mu$m in diameter, electromagnetic lens 26 must demagnify electron beams by at least 100 to achieve a resolution of 100 nm (nanometers) on the writing plane on substrate 28.

The large magnification and demagnification used in charged particle beam column 10 typically requires a complex lens system and a long column length. The complex lens system generally used in charged particle beam column 10 is not shown in FIG. 1 for the sake of clarity. A typical length of a conventional charged particle beam column 10 is approximately 0.5 m. In a long column, electron-electron interactions increase the beam blur in each of the electron beams, which consequently results in lower throughput.

Additional spurious effects are caused by flood illumination of BAA 20 with electron beams 18, such as loss of efficiency, heating, and charging. FIG. 2 is a perspective view of BAA 20 with electron beams 18 flood illuminating apertures 20a as well as an area on the surface of BAA 20. As shown in FIG. 2, a large amount of flood illumination 18 is lost illuminating the surface of BAA 20 and only a small percentage of flood illumination 18 is actually passed through apertures 20a, resulting in a transmission efficiency of only a few percent. Consequently, a large amount of energy from flood illumination 18 is absorbed by the surface of BAA 20 itself, rather than being transmitted through apertures 20a. The absorbed energy from flood illumination 18 produces heating of BAA 20 resulting in expanding aperture diameters and thermal drift, i.e., uncontrolled shift of apertures with respect to optical axis A and relative to one another. Further, flood illumination 18 that is incident on the surface of BAA 20 often results in undesirable charging of BAA 20.

In addition, flood illumination 18 may generate scattering of electrons off the edges and side walls of apertures 20a resulting in undesirable resist exposure. FIG. 3 is a cross-sectional view of a single aperture 20a of BAA 20 with a single electron ray path 30, illustrated as an arrow. Typically, the electron beams 18 used to flood illuminate of BAA 20 will contain electron ray paths that are not perfectly perpendicular with BAA 20. Thus, as shown in FIG. 3, an electron beam 30 may be scattered at an angle by the edge or a sidewall of aperture 20a. When a large number of electrons are scattered, the beam may become blurred which reduces resolution and decrease pattern fidelity.

SUMMARY

In accordance with an embodiment of the present invention, a charged particle beam is split into multiple charged particle beamlets that are directed onto a blanking aperture array. An electrostatic or magnetic electron lens may focus each charged particle beamlet of the charged particle beam on a separate aperture of the blanking aperture array. Thus, no magnification of the source is required. The beam splitter is e.g. a biprism using a conductive filament with a DC bias voltage, or a pair of orthogonally intersecting biprisms. By positioning beam splitters in a serial manner, additional charged particle beamlets may be produced.

Where a small diameter charged particle source, such as a field emission source or Schottky emission source is used, a crossover of the individual charged particle beamlets may occur within the separate apertures of the blanking aperture array. Consequently, no or only a small amount of demagnification of the beamlets passing through the blanking aperture array is necessary to form a small exposure pixel on the writing plane. Further, charged particle beam scattering off the edges or sidewalls of the apertures can be eliminated.

Regardless of the type of charged particle source used, by focusing each individual charged particle beam into a separate aperture of the blanking aperture array, no heating, thermal drift, or charging of the blanking aperture array will occur. Thus, the charged particle beam and blanking aperture array have a high transmission efficiency.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 4:
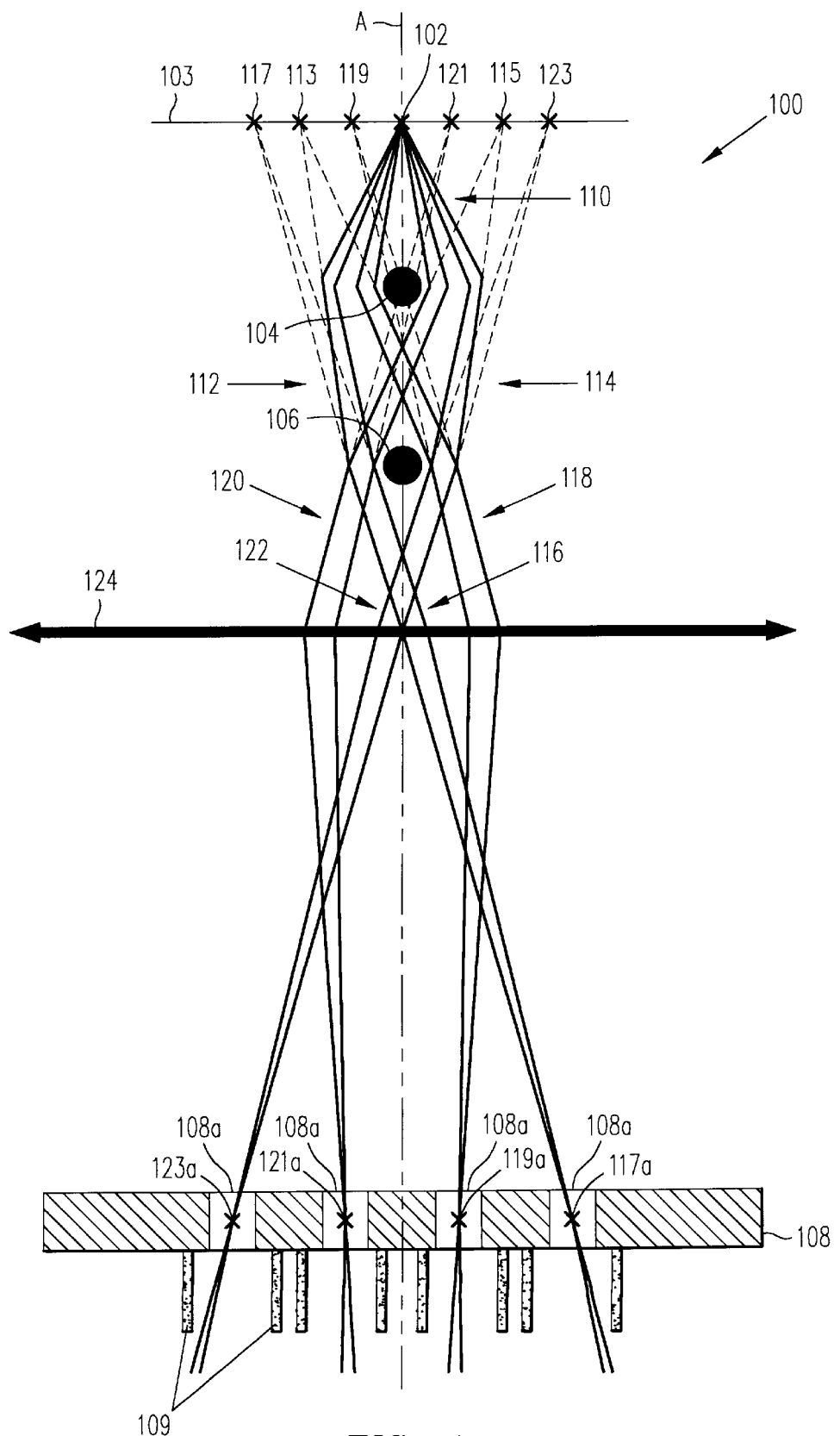
FIG. 4 is a cross-sectional view of a charged particle beam column that uses two beam splitters in series to split a charged particle beam into four beams that are then focused into a blanking aperture array.

FIG. 4 is a cross-sectional view of a charged particle beam column 100 with a charged particle beam source 102 and two serial beam splitters illuminating a BAA 108 in accordance with an embodiment of the present invention. For the sake of clarity charged particle beam column 100 will be described as an electron beam column, however, it should be understood that other types of charged particle beams, i.e., ions, may also be used.

Charged particle beam column 100 includes an electron source 102 that has a small effective source size and high brightness, such as field emission or Schottky source. For example, electron source 102 has an effective source size of approximately 20 nm and a brightness of approximately $10^8$ A/(cm$^2$steradian). A Schottky emission source available from FEI, Inc. in Hillsboro, Oregon is one example of such an electron source. Of course electron source 102 is actually the effective electron source that is generated by an electron emitter (not shown) and including any necessary lens elements (not shown) as is well understood in the art.

Electron source 102 generates an electron beam 110 along an optical axis A. Electron beam 110 has a current e.g. between approximately 0.5 µamp and 3 µamp. A beam splitter, shown as biprism 104 is aligned perpendicularly to optical axis A and is located e.g. one micrometer to 100 mm beneath electron source 102. Biprism 104 splits electron beam 110 into two separate electron beamlets 112 and 114.

Figure 5:
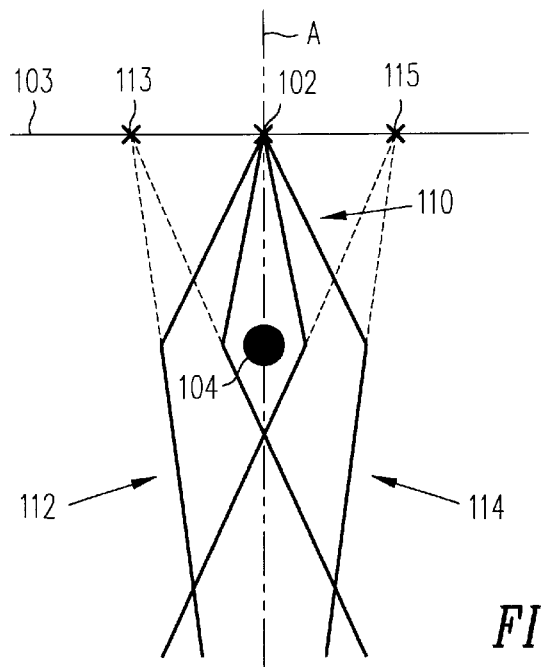
FIG. 5 is a cross-sectional view of a charged particle beam column with a beam splitter to split the charge particle beam.

FIG. 5 is a cross-sectional view of electron source 102 and biprism 104 illustrating the splitting of electron beam 110. Biprisms, which are generally used in electron holography applications, are a thin conductive filament having a DC bias voltage applied across the device. Biprism 104 is, by way of an example, a quartz fiber coated with a conductive metal material, e.g., gold or platinum, and is approximately 1 µm in diameter. Biprism 104 is biased with either a positive or negative DC voltage, e.g., 1 to 100 volts. Additional electron lenses may be needed to adequately focus the electron beams at the desired location, such as at subsequent beam splitters or at the BAA 108.

As is well understood by those of ordinary skill in the art, a positive bias voltage on biprism 104 will attract the (negatively charged) electrons within electron beam 110 and will cause electron beam 110 to be split into two separate electron beamlets 112 and 114. Each of electron beamlets 112 and 114 will have approximately half the total current of the original electron beam 110. Electron beamlets 112 and 114 may have slightly less than half the current because of losses from electron scattering by biprism 104; however, these losses will be negligible.

The angle of deflection of electron beamlets 112 and 114 depends on the geometry of the system and is proportional to the bias voltage applied on biprism 104. By way of an example, a 50 kV electron beam will be deflected by approximately 0.1 mrad (millirad) when the biprism is biased to approximately 10 V.

The two electron beamlets 112 and 114 define two "virtual" electron sources 113 and 115, respectively, which form the object plane 103 for the charged particle beam column. The two virtual electron sources 113 and 115 defined by respective electron beamlets 112 and 114 will be slightly larger than the size of electron source 102 due to aberrations introduced by biprism 104. By controlling the distance between biprism 104 and electron source 102 as well as the bias voltage on biprism 104, the deflection angle of electron beamlets 112 and 114 can be manipulated to define virtual electron sources 113 and 115 separated by a desired distance, e.g., several micrometers.

A second beam splitter, shown as biprism 106, is aligned perpendicularly by optical axis A and in parallel with biprism 104 and is positioned beneath biprism 104. Biprism 106 is similar in structure and operation as biprism 104. The distance between biprism 106 and biprism 104, which may be varied from one micrometer to 100 mm, is dependent on the angle of deflection of electron beamlets 112 and 114. Electron beamlets 112 and 114 intersect biprism 106, which splits electron beamlet 112 into two separate electron beamlets 116, 118 and splits electron beamlet 114 into electron beamlets 120 and 122. Thus, original electron beam 110 generated by electron source 102 is split into four separate electron beamlets 116, 118, 120 and 122, each with approximately one fourth the current of electron beam 110. The four separate electron beamlets 116, 118, 120 and 122 generated by biprism 106 each define a separate virtual electron source 117, 119, 121, and 123 approximately in object plane 103.

A conventional electromagnetic lens 124 then focuses electron beamlets 116, 118, 120 and 122 in the plane of BAA 108. Electron beamlets 116, 118, 120 and 122 are controlled by manipulating the DC bias voltage on biprisms 104 and 106 such that crossover of electron beamlets 116, 118, 120 and 122 occurs in separate apertures 108a of BAA 108, forming virtual electron sources images 117a, 119a, 121a, 123a in apertures 108a. Although electron beamlets 116, 118, 120 and 122 are shown transmitting through apertures 108a at slight tilt angles, it should be understood that these tilt angles are greatly exaggerated for the sake of clarity of FIG. 4 and do not significantly affect the performance of charged particle beam column 100. However, for very large BAA sizes the tilt angles may become excessively large. To minimize aberrations caused by excessively large tilt angles, a field electron lens must be placed near the bottom surface of the BAA.

Although electromagnetic lens 124 is shown as positioned below biprisms 104 and 106, it should be understood that electromagnetic lens 124 may also be positioned at other locations in charged particle beam column 100, for example between biprism 104 and electron source 102. However, the use of additional lenses may be necessary to achieve the desired focus of electron beamlets 116, 118, 120, and 122 on serial beam splitters and on BAA 108. Using a number of electromagnetic lenses to focus an electron beam at a desired location is well within the knowledge of those of ordinary skill in the art.

Charged particle beam column 100 includes an additional lens (not shown) to focus electron beamlets 116, 118, 120 and 122 on the surface of a writing plane (not shown). Electrostatic deflectors 109 are used to conventionally "close" the individual apertures 108a of BAA 108 by deflecting the electron beam passing through with an electric potential, thereby preventing that electron beam from reaching the writing plane. Electrostatic deflectors 109 are conventionally controlled to permit electron beamlets 116, 118, 120, 122 to pass in accordance with the desired exposure pattern.

Figure 1:
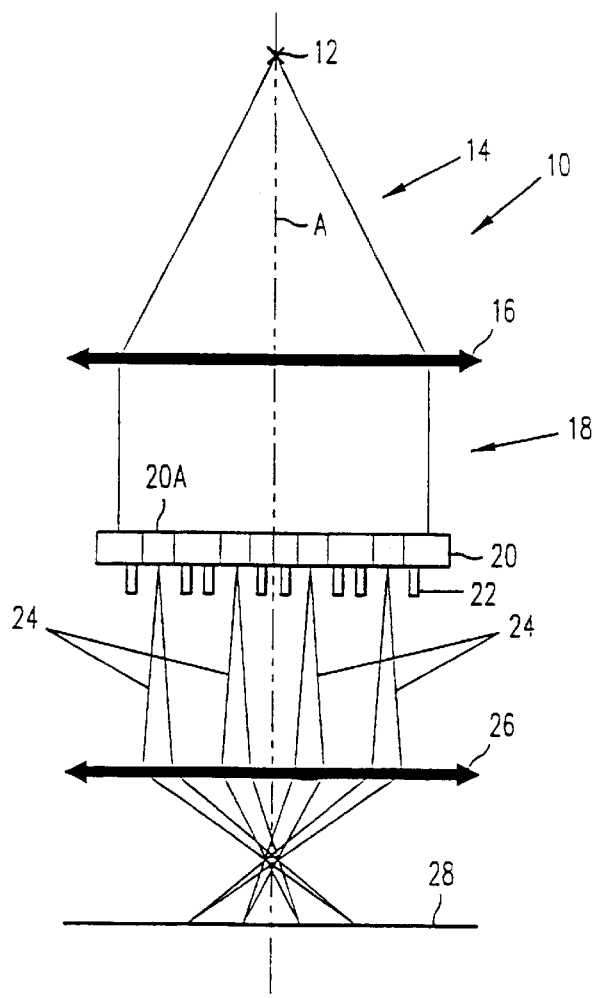
FIG. 1 is a cross-sectional view of a simplified charged particle beam column using a blanking aperture array to generate individual beams.
Figure 2:
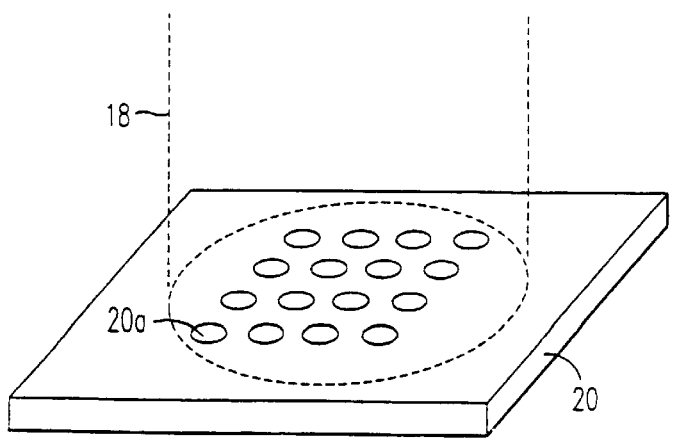
FIG. 2 is a perspective view of a blanking aperture array with flood illumination illuminating the apertures as well the surface of the blanking aperture array.
Figure 3:
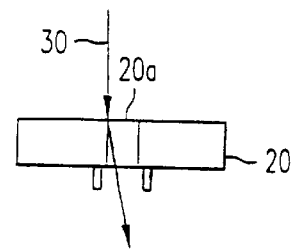
FIG. 3 is a cross-sectional view of a blanking aperture array with a single electron beam shown scattering off the edge of the aperture.

BAA 108 can have significantly more apertures 108a than shown in FIG. 4, which may be accommodated by arranging several beam splitters serially in order to achieve the desired amount of multiple electron beams. Moreover, it should be understood that BAA 108 will have apertures 108a in two dimensions, similar to BAA 20 shown in FIG. 2. Although FIG. 4 shows electron beam 110 split in one dimension for the sake of clarity, electron beam 110 can be split in two dimensions to accommodate all apertures 108a.

Figure 6:
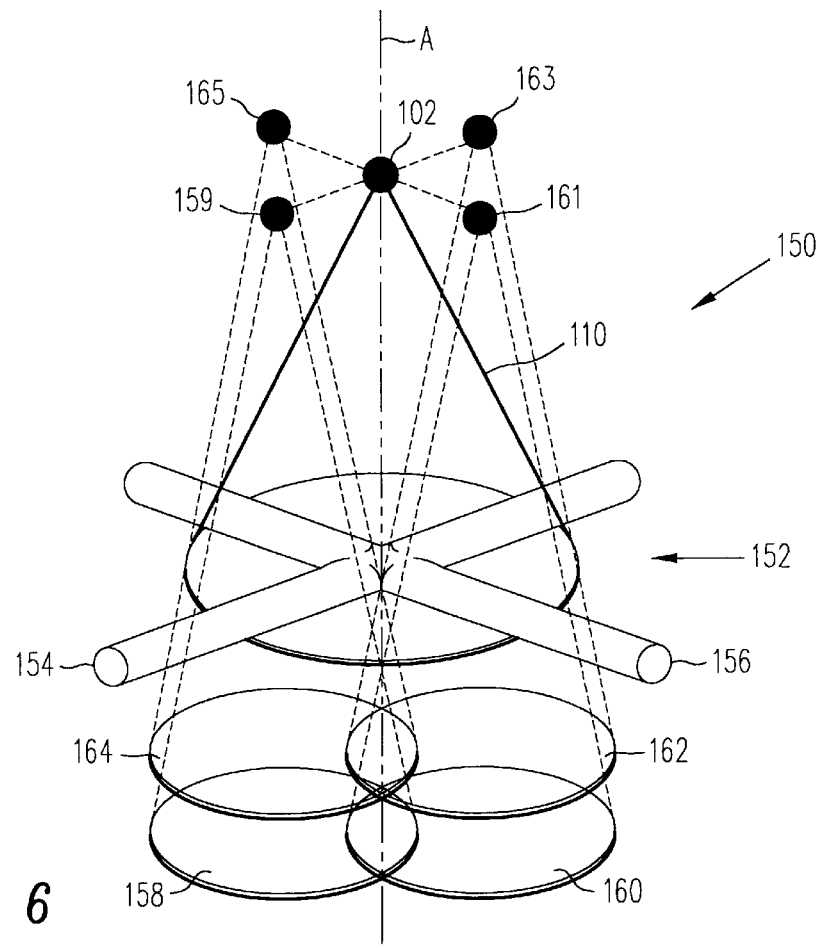
FIG. 6 is a perspective view of charged particle beam column with a beam splitter using two orthogonally intersecting biprisms to split a beam into four beams.

FIG. 6 is a perspective view of charged particle beam column 150 where an electron beam is split into four electron beams in two dimensions. Charged particle beam column 150 is similar to charged particle beam column 100 shown in FIGS. 4 and 5, like designated elements being the same. However, charged particle beam column 150 uses a beam splitter 152 to split electron beam 110 in two dimensions. One example of such beam splitter 152 has two orthogonally intersecting biprisms 154 and 156. Biprisms 154 and 156 are thin conductive filaments, intersecting at right angles to each other and having a DC bias voltage. The DC bias voltage is variable depending on the desired angle of deflection of the split electron beams and may range for example between 1 to 100 volts.

As illustrated in FIG. 6, beam splitter 152 splits electron beam 110 into four electron beamlets 158, 160, 162, and 164, which define respective virtual electron sources 159, 161, 163, and 165 in the object plane. Each of the four electron beamlets 158, 160, 162, and 164 generated by beam splitter 152 has approximately one fourth the current of electron beam 110. By applying the appropriate bias voltage to beam splitter 152 and with the proper geometry, e.g., the relative position of beam splitter 152 to electron source 102, virtual electron sources 159, 161, 163, and 165 may be separated by several micrometers.

Beam splitter 152 may be used in place of biprism 104 and 106 in charged particle beam column 100, shown in FIG. 4, where the intersection of orthogonal biprisms 154 and 156 in beam splitter 152 is centered on the optical axis A of the column 100 in each serial beam splitter. Thus, electron beam 110 is split into sixteen individual electron beamlets to be focused on BAA 108. Each of the sixteen electron beamlets have approximately one sixteenth the current of electron beam 110.

It is desirable to split electron beam 110 into the same amount of individual electron beams as there are apertures 108a in BAA 108 to utilize all apertures 108a and to avoid wasting current in unused electron beams. Additional electron beamlets may be generated by increasing the number of serial beam splitters in charged particle beam column 100. Additional beam splitters may require the use of electron lenses to focus the split electron beams onto the intersection between the next serial beam splitter and optical axis A. Using electron lenses to focus electron beams onto a downstream beam splitter is well within the skill of those in the art.

The crossover of each electron beamlet 116, 118, 120 and 122 forms the image of respective virtual electron sources 117, 119, 121, and 123. Because virtual electron sources 117, 119, 121, and 123 are approximately the same diameter as electron source 102, e.g., 20 nm, the crossover of electron beamlets 116, 118, 120 and 122 occurs within apertures 108a, without undesirable over illumination when a small diameter electron source is used, such as a Schottky or field emission source. Because the use of beam splitters 104 and 106 efficiently illuminates BAA 108 by minimizing over illumination, little or no current from the electron beams is wasted in the heating or charging of the surface of BAA 108 itself. Charged particle beam column 100 therefore minimizes spurious effects caused by conventional flood illumination, such as heating, thermal drift, and charging. Further, when a small diameter electron source 102 is used, the crossover occurs within apertures 108a thereby minimizing electron scattering from the aperture edges and sidewalls. Moreover, little or no magnification for BAA illumination or demagnification to the writing plane is required and thus charged particle beam column 100 is less complex and significantly shorter than conventional columns, thereby minimizing electron—electron interaction resulting in higher throughput.

Where conventional thermionic or $LaB_6$ electron emitters are used as electron source 102, electron beamlets 116, 118, 120 and 122 will marginally over illuminate apertures 108a resulting in the need to demagnify electron beamlets 116, 118, 120 and 122 prior to the writing plane (not shown) and potentially generating electron scattering. Nevertheless, even with a thermionic or $LaB_6$ electron emitter, charged particle beam column 100 efficiently illuminates BAA 108 relative to conventional methods thereby reducing heating, thermal drift and charging.

Although the present invention has been described in considerable detail with reference to certain versions thereof, other versions are possible. For example, charged particle beam column 100 may be an ion beam column if desired. Further, the position of electromagnetic lens 124 may be altered and/or additional electromagnetic lenses may be used to focus the electron beams 116, 118, 120, and 122 at the plane of BAA 108. Additional serial beam splitters may be used to achieve the desired number of splits of electron beam 110 to generate multiple electron beamlets. Biprisms 104 and 106 may be replaced by beam splitter 152 using orthogonal biprisms 154 and 156, shown in FIG. 6, to generate additional split electron beamlets in two dimensions. Therefore, the spirit and scope of the appended claims should not be limited to the description of the versions depicted in the figures.

What is claimed is:

1. A charged particle beam column comprising:

a charged particle beam source emitting a charged particle beam;

at least one beam splitter located downstream of said charged particle beam source, said at least one beam splitter splitting said charged particle beam into multiple charged particle beams; and a blanking aperture array, wherein said multiple charged particle beams are directed onto said blanking aperture array.

2. The charged particle beam column of claim 1, further comprising a charged particle beam lens positioned downstream of said at least one beam splitter, said charged particle beam lens focusing said multiple charged particle beams on said blanking aperture array.

3. The charged particle beam column of claim 2, further comprising a second charged particle lens downstream of said blanking aperture array and directing said multiple charged particle beams passing through the apertures of said blanking aperture array onto a surface of a substrate.

4. The charged particle beam column of claim 1, wherein each charged particle beam of said multiple charged particle beams is directed to a separate aperture of said blanking aperture array.

5. The charged particle beam column of claim 4, wherein each charged particle beam of said multiple charged particle beams is focused in a separate aperture of said blanking aperture array.

6. The charged particle beam column of claim 1, wherein each charged particle beam in said multiple charged particle beams defines separate virtual charged particle beam sources in an object plane of said charged particle beam column, said separate virtual charged particle beam sources are spaced apart from said charged particle beam source and wherein the image of said virtual charged particle beam sources are directed into a separate aperture of said blanking aperture array.

7. The charged particle beam column of claim 1, wherein said charged particle beam source is an electron source.

8. The charged particle beam column of claim 7, wherein said electron source is a field emission source.

9. The charged particle beam column of claim 7, wherein said electron source is a Schottky source.

10. The charged particle beam column of claim 1, wherein each beam splitter includes a conductive filament to which a bias voltage is applied.

11. The charged particle beam column of claim 10, wherein each beam splitter includes a pair of orthogonally arranged conductive filaments to which bias voltages are applied.

12. The charged particle beam column of claim 1, wherein said at least one beam splitter comprises a plurality of beam splitters arranged in series.

13. A method comprising:

producing a charged particle beam;

splitting said charged particle beam into multiple charged particle beams; and directing said multiple charged particle beams on a blanking aperture array.

14. The method of claim 13, wherein said multiple charged particle beams are directed on separate apertures of said blanking aperture array.

15. The method of claim 13, wherein said charged particle beam is an electron beam.

16. The method of claim 13, wherein said splitting said charged particle beam into multiple charged particle beams comprises:

intersecting said charged particle beam with a first beam splitter; and applying a bias voltage to said first beam splitter whereby said bias voltage on said first beam splitter deflects said charged particle beam thereby splitting said charged particle beam into multiple charged particle beams.

17. The method of claim 16, further comprising:

intersecting said multiple charged particle beams with a second beam splitter; and applying a second bias voltage to said second beam splitter whereby said second bias voltage on said second beam splitter deflects said each charged particle beam in said multiple charged particle beams, thereby splitting said each charged particle beam.

18. The method of claim 16, further comprising:

providing a series of beam slitters under said first beam splitter; and applying bias voltages to each beam splitter in said series of beam splitters, whereby each beam splitter in said series of beam splitters deflects each charged particle beam in said multiple charged particle beams, thereby splitting each charged particle beam.

19. The method of claim 16, wherein said beam splitter includes a pair of intersecting conductive filaments arranged orthogonally to one another.

20. The method of claim 16, wherein said directing said multiple charged particle beams on a blanking aperture array comprises:

focusing said multiple charged particle beams in each of the charged particle beams in said multiple charged particle beams; and adjusting said bias voltage on said beam splitter to locate said crossover of each of the charged particle beams in separate apertures of said blanking aperture array.

21. A charged particle beam column comprising:

a charged particle beam source emitting a charged particle beam along an optical axis;

at least one beam splitter located downstream of said charged particle beam source, said at least one beam splitter splitting said charged particle beam into multiple charged particle beams, each beam splitter being at least one conductive filament that passes through said optical axis and to which a bias voltage is applied; and a blanking aperture array, wherein said multiple charged particle beams are directed onto said blanking aperture array.

22. The charged particle beam column of claim 21, wherein each charged particle beam of said multiple charged particle beams is directed to a separate aperture of said blanking aperture array.

23. The charged particle beam column of claim 21, wherein each charged particle beam of said multiple charged particle beams is focused in a separate aperture of said blanking aperture array.

24. The charged particle beam column of claim 21, wherein said charged particle beam source is an electron source.

25. The charged particle beam column of claim 21, wherein each beam splitter is a pair of orthogonally arranged conductive filaments to which a bias voltage is applied, said pair of orthogonally arranged conductive filaments passes through said optical axis.

26. The charged particle beam column of claim 21, wherein said at least one beam splitter comprises a plurality of beam splitters arranged in series along said optical axis.

27. The method of claim 21, further comprising:

providing a plurality of beam splitters in series along said optical axis; and applying bias voltages to each of said plurality of beam splitters, whereby said bias voltage on each beam splitter deflects a charged particle beam incident on said each beam splitter, thereby splitting each charged particle beam into multiple charged particle beams.

28. The method of claim 21, wherein each beam splitter is a pair of intersecting conductive filaments arranged orthogonally to one another and that pass through said optical axis.

29. A method comprising:

producing a charged particle beam along an optical axis;

splitting said charged particle beam into multiple charged particle beams with at least one beam splitter, each beam splitter being at least one conductive filament that passes through said optical axis and has a bias voltage applied to it; and directing said multiple charged particle beams on a blanking aperture array.

30. The method of claim 29, wherein said multiple charged particle beams are directed on separate apertures of said blanking aperture array.

31. The method of claim 29, wherein said charged particle beam is an electron beam.

32. The method of claim 21, wherein said directing said multiple charged particle beams on a blanking aperture array comprises:

focusing said multiple charged particle beams; and adjusting said bias voltages on said plurality of beam splitters to locate said crossover of each of said multiple charged particle beams in separate apertures of said blanking aperture array.

* * * * *

UNITED STATES PATENT AND TRADEMARK OFFICE
CERTIFICATE OF CORRECTION

PATENT NO. : 6,157,039
DATED : December 5, 2000
INVENTOR(S) : Marian Mankos

It is certified that error appears in the above-identified patent and that said Letters Patent is hereby corrected as shown below:

Column 1,
Lines 8-10, insert the following:
 -- This invention was made with U.S. Government support under Contract No.: N00019-95-C-0059 awarded by the Department of the Navy. The Government has certain rights in this invention. --

Signed and Sealed this

Twenty-eighth Day of January, 2003

JAMES E. ROGAN
*Director of the United States Patent and Trademark Office*